(12) United States Patent
Barcella et al.

(10) Patent No.: US 11,353,416 B2
(45) Date of Patent: Jun. 7, 2022

(54) PROTECTIVE DEVICE FOR ELECTROCHEMICAL ELECTRODES HAVING A LIQUID JUNCTION

(71) Applicant: Mettler-Toledo GmbH, Greifensee (CH)

(72) Inventors: Corrado Barcella, Endingen (CH); Philippe Ehrismann, Uster (CH)

(73) Assignee: METTLER-TOLEDO GMBH, Greifensee (CH)

( * ) Notice: Subject to any disclaimer, the term of this patent is extended or adjusted under 35 U.S.C. 154(b) by 304 days.

(21) Appl. No.: 16/536,493

(22) Filed: Aug. 9, 2019

(65) Prior Publication Data
US 2020/0057015 A1    Feb. 20, 2020

(30) Foreign Application Priority Data
Aug. 15, 2018   (EP) ..................................... 18189149

(51) Int. Cl.
*G01N 27/403*   (2006.01)
*G01N 27/401*   (2006.01)
(Continued)

(52) U.S. Cl.
CPC ........... *G01N 27/301* (2013.01); *B65D 85/38* (2013.01); *G01N 27/401* (2013.01);
(Continued)

(58) Field of Classification Search
CPC .. G01N 27/403; G01N 27/401; G01N 27/301; G01N 27/31; G01N 27/302; G01N 27/333
See application file for complete search history.

(56) References Cited

U.S. PATENT DOCUMENTS

| | | |
|---|---|---|
| 5,762,185 A | 6/1998 | Dulger |
| 10,598,626 B2 * | 3/2020 | Wunderlich ....... G01N 27/4161 |
| 2008/0134811 A1 | 6/2008 | Milanovic et al. |

FOREIGN PATENT DOCUMENTS

| | | |
|---|---|---|
| CH | 701837 B1 | 3/2011 |
| DE | 4421062 A1 | 12/1995 |
| DE | 102014101759 A1 | 8/2015 |

OTHER PUBLICATIONS

Merriam-Webster online dictionary definition of "protrusion" downloaded Aug. 31, 2021 from https://www.merriam-webster.com/dictionary/protrusion#synonyms (Year: 2021).*

(Continued)

*Primary Examiner* — Alexander S Noguerola
(74) *Attorney, Agent, or Firm* — Buchanan Ingersoll & Rooney PC (57) ABSTRACT

A protective device is disclosed for electrochemical electrodes having a liquid junction, and a transport and retention system therefor. The protective device can include a casing which is configured as a hollow cylinder and which has a inner circumferential first protrusion; a delimiting device which together with the first protrusion delimits a first casing segment having a first inner diameter; a spacer, which is configured as a hollow cylinder having an outer diameter corresponding to the first inner diameter; and a first sealing ring and a second sealing ring between which the spacer is disposed; wherein the first sealing ring, the second sealing ring and the spacer are disposed in an interior of the first casing segment, so that the first sealing ring and the second seal ring delimit a first protection space for a liquid junction whose inner diameter corresponds to an inner diameter of the spacer.

20 Claims, 3 Drawing Sheets

(51) Int. Cl.
  *G01N 27/30*  (2006.01)
  *B65D 85/38*  (2006.01)
  *H05K 5/00*  (2006.01)
  *G01N 27/333*  (2006.01)
(52) U.S. Cl.
  CPC ......... *G01N 27/403* (2013.01); *H05K 5/0004* (2013.01); *G01N 27/302* (2013.01); *G01N 27/333* (2013.01)

(56) References Cited

OTHER PUBLICATIONS

Merriam-Webster online dictionary definition of "protrudes" downloaded Aug. 31, 2021 from https://www.merriam-webster.com/dictionary/protrudes (Year: 2021).*
Search Report dated Feb. 21, 2019, by the European Patent Office for Application No. 18189149.0.

* cited by examiner

PROTECTIVE DEVICE FOR ELECTROCHEMICAL ELECTRODES HAVING A LIQUID JUNCTION

RELATED APPLICATION

This application claims priority under 35 U.S.C. § 119 to European Patent Application No. 18189149.0 filed in Europe on Aug. 15, 2018, the entire content of which is hereby incorporated by reference in its entirety.

FIELD

The disclosure relates to a protective device for electrochemical electrodes having a liquid junction for protecting the electrode in the transport, storage and/or retention, as well as a transport and retention system with such a protective device and such an electrochemical electrode.

BACKGROUND INFORMATION

Electrochemical electrodes having a liquid junction are, for example, reference electrodes, which are used in conjunction with a working electrode and/or a counter electrode. Furthermore, combination electrodes are known as electrochemical electrodes with liquid junction, which comprise an electrochemical reference electrode and a measuring electrode in a common housing. The liquid junction exists between an electrolyte or the reference electrolyte arranged in the electrode and the measured medium and is, in operation or when a measurement process is performed, an electrochemical communication between the reference electrolyte and the medium to be measured.

An electrochemical electrode as a reference electrode includes, inter alia, a housing in which are arranged a reference electrolyte, a reference diverting element immersing into this reference electrolyte and the liquid junction. The liquid junction may be formed as an open hole, as a membrane or diaphragm in the housing wall.

The term "printed" electrode is understood to mean electrodes the electrode of which is under slight overpressure, so that the electrolyte continuously exits through the liquid junction. This serves to prevent contamination of the electrolyte. Such printed electrodes includes frequently a diaphragm as liquid junction in combination with a liquid electrolyte. Such printed electrodes are used, in particular, as reference electrodes alone or in combination electrodes.

For the transport, storage and/or retention of electrodes having a liquid junction, the liquid junction must be closed to prevent leakage of the electrolyte and/or the partial or complete relieve of the overpressure and to ensure in this way the operative readiness of electrode after transport, storage and/or retention. This closing is done for example by applying a drop of adhesive on the liquid junction which is subsequently cured. Likewise, the use of other sealant is known to prevent the leakage of and/or a pressure drop in the electrolyte. Before using the electrochemical electrode the adhesive or the sealant, however, must be removed.

An issue with this method of sealing the liquid junction is that it is cumbersome and critical to apply the adhesive or the sealant on the one hand as well as to completely remove it prior to using the electrochemical electrode without damaging the liquid junction. For example, residues of the adhesive or the sealant can remain on the housing or the shaft of the electrode and, worst case, contaminate the medium to be examined. If the removal of the adhesive or sealant is forgotten, the electrode would not even function.

Since printed electrodes are not only used in the laboratory but also in process plants, the seal must imperatively be removed before installation in a process plant.

SUMMARY

A protective device is disclosed for electrochemical electrodes having a liquid junction, the protective device comprising: a casing which is configured as a hollow cylinder and which has a inner circumferential first protrusion; a delimiting means which together with the first protrusion delimits a first casing segment having a first inner diameter; a spacer, which is configured as a hollow cylinder having an outer diameter corresponding to the first inner diameter; and a first sealing ring and a second sealing ring between which the spacer is disposed; wherein the first sealing ring, the second sealing ring and the spacer are disposed in an interior of the first casing segment, so that the first sealing ring and the second seal ring delimit a first protection space for a liquid junction whose inner diameter corresponds to an inner diameter of the spacer.

BRIEF DESCRIPTION OF THE DRAWINGS

The invention will be explained below with reference to exemplary embodiments illustrated in highly schematic drawings, in which like elements are denoted by comparable reference numerals.

DETAILED DESCRIPTION

A protective device is disclosed that can serve, when in use, as mechanical protection of the electrochemical electrode with liquid junction during its transport, storage and/or retention, and which also can ensure that an overpressure is maintained in the electrolyte.

A protective device for electrochemical electrodes with liquid junction as well as a system for the storage, transport and/or retention of such electrochemical electrode are therefore disclosed.

An exemplary protective device for electrochemical electrodes having a liquid junction includes a casing which is configured as a hollow cylinder and which has an inner circumferential first protrusion which projects into an interior of the casing. The protective device also includes a delimiting means which together with the first protrusion delimits a first casing segment having a first inner diameter; a spacer which is configured as a hollow cylinder having an outer diameter corresponding to the first inner diameter; and a first sealing ring and a second sealing ring between which the spacer is disposed. The first sealing ring, the second sealing ring and the spacer are disposed in the interior of the first casing segment, so that the first sealing ring and the second seal ring delimit a first protection space or protection chamber for the liquid junction of an electrochemical electrode whose inner diameter corresponds to the inner diameter of the spacer.

The protective device is configured such that in its use state it can be pushed as far over or on an electrode such that its liquid junction is disposed in the first protection space. To ensure this, the smallest inner diameter of the components forming the protective device substantially corresponds to the outer diameter of the electrode to be protected. In use, the two sealing rings close the first protection space against the outer environment of the electrode and facilitate that an electrolyte disposed in the interior of the electrode exits only into the first protection space which has a very small volume, so that hardly any electrolyte can exit the electrode. In the case of a printed electrode, wherein the electrolyte is kept at a certain overpressure, a pressure drop can also be substantially prevented.

An exemplary protective device according to the disclosure allows to transport, store or retain electrochemical electrodes safely. In this case, the overpressure within the electrode is maintained in the event that it is disposed in the protective device, and the protective device thus is in its state of use.

The protective device can be further characterized in that it is reusable. It can be utilized for example in the laboratory when the electrode is not in use and can be readily removed for measurements.

The spacer has an outer diameter that corresponds approximately to the inner diameter of the first casing segment and a wall thickness that corresponds approximately to the depth of the first protrusion.

The first and the second sealing ring are for example, elastically deformable and thus compressible. In addition, the two sealing rings each have an outer ring diameter which corresponds approximately to the inner diameter of the first casing segment and a cord diameter which corresponds approximately to the depth of the first protrusion.

In an exemplary embodiment the delimiting means is configured as a second protrusion in the interior of the casing.

The first protection space is delimited by the first and second sealing rings and the spacer disposed between these two sealing rings, wherein the spacer is disposed with some tolerance or movably in the casing so that in use, the two sealing rings on both sides can sealingly abut the spacer, as well as the electrode, wherein the first sealing ring also abuts the first protrusion.

In a further exemplary embodiment the casing includes a first connecting means and the protective device includes a fastening element which is configured as a hollow cylinder and includes the delimiting means and a second connecting means for connecting the fastening element to the casing; wherein the delimiting means is disposed at a first end of the fastening element, so that in the assembled state or in its use state, the delimiting means is pressed against the second sealing ring and thus exerts pressure on the first and second sealing rings.

In this embodiment, in the assembled or composite state of the protective device or when in use, the first sealing ring abuts the first protrusion and a first face of the spacer. The second sealing ring abuts the delimiting means of the fastening element and a second face of the spacer. Here, the casing and the fastening element are connected with one another by means of the first and second connecting elements.

The assembled state of the protective device can be characterized in that the casing is connected to the fastening element, however, there is no force exerted on the parts located in the interior of the casing, in particular the spacer and the two sealing rings. In this state, there is no electrode in the protective device.

The protective device can, in its use state, when it is placed on an electrochemical electrode which is not in use, thus partially enclose the electrode and, the casing is detachably connected to the fastening element. However, a force is exerted on the parts located in the interior of the attachment body, namely the spacer and the two sealing rings.

In an exemplary embodiment, the first connecting means is configured as a female thread and the second connecting means is configured as a male thread, so that the fastening element can be screwed into the casing. In this way, the fastening element can also exert pressure on the two sealing rings and the spacer via the delimiting element, especially when also an electrochemical electrode is disposed in the protective device.

In a further exemplary embodiment the first connecting means and the second connecting means are configured as parts of a bayonet connection, so that they engage form-fittingly when connecting the casing and the fastening element. In addition, in this embodiment, the pressure applied to the two sealing rings and the spacer is determined by the unique "CLOSED" position of the bayonet mount. A bayonet mount locks into its "CLOSED" position so that the pressure exerted by the delimiting means is always the same.

Further, the fastening element can include a structured grip segment at a second end, wherein the second end is opposite of the delimiting means. The structured grip segment may, for example, have knurling or have other characteristics that enable a user to better grip or handle the fastening element.

In another exemplary embodiment, the fastening element further includes a bead, which is disposed between the grip segment and the delimiting element. In the assembled or assembled state this circumferential bead engages with tolerance in a groove on the casing, and thus forms a stop for the fastening element. In this way it is ensured that the fastening element locks in position in the casing and can only be removed by applying force. In addition, the stop formed by groove and bead serves to limit the depth of penetration of the fastening element and thus also the pressure exerted by the delimiting means on the spacer via the sealing rings. This is particularly important when using the protective device for glass electrodes because in this way accidental crushing of the glass shaft when attaching the protective device can be prevented.

The bead may also be configured or act as a sealing lip which additionally seals the first casing segment.

The casing can include a second casing segment, which is likewise configured as a hollow cylinder and terminally connected with the first casing segment.

The second casing segment may represent an extension of the first casing segment which, in its use state, surrounds a measurement region of the electrochemical electrode and protects it against mechanical stress. For example, the first and second casing segment are firmly connected together or configured as a single component.

In a further exemplary embodiment, the second casing segment is closed on one side, more precisely terminally, so that in the interior of the second casing a second protection space or a second protection chamber for receiving a wetting liquid is formed. In its use state, the measurement region of the electrochemical electrode projects into this second protection space. Additionally, the second protection space may be filled with an electrolyte solution and serve to keep the measuring region of the electrochemical electrode moist during transport, storage and/or retention. This is particularly relevant in combination electrodes for pH determination with a reference electrode and a measuring electrode with a pH-sensitive glass membrane, since this pH glass membrane may not dry out.

For this reason, wetting caps are known for sensors with sensitive glass membranes, particularly for pH sensors with pH-sensitive glass membrane and comparable sensors for measuring other ions, which wetting caps are pushed over this sensitive glass membrane for the transport, storage and/or retention of the sensors between two measurements. Known wetting caps are filled with a suitable wetting liquid to prevent drying out of the glass membrane.

U.S. Pat. No. 5,762,185, the disclosure of which is hereby incorporated by reference in its entirety, discloses a wetting cap for wetting the glass membrane of a pH sensor, when it is not in use. For inserting the electrode, the wetting cap is open at one end and has there a means for fastening to the electrode shaft. Further, the wetting cap includes a seal to retain the wetting liquid. More wetting caps are known from various manufacturers of pH glass sensors.

The second casing segment can include a stop for one end of the electrochemical electrode. In this way, the insertion depth of the electrode is limited in the protective device.

The casing of the protective device is for example, made of polycarbonate, polymethyl methacrylate (PMMA) or polyethylene terephthalate (PET-G), or other suitable material. These materials are relatively rigid and therefore are especially suitable for the mechanically stable casing.

The fastening element of the protective device is for example, made of polycarbonate or polyoxymethylene (POM), or other suitable material. Logically, the materials of the protective device, as well as the sealing rings, should be resistant against liquids with whom they come in contact when in its use state; for example, they should be resistant against the electrolyte used in the electrode.

Another aspect of the disclosure relates to a transport and retention system with protective device according to the disclosure and an electrochemical electrode having a liquid junction, wherein the liquid junction is disposed in the first protection space of the protective device during transit, storage and/or retention.

Such a system makes possible that the liquid junction of an electrochemical electrode disposed in a protective device is sealed against the environment, wherein, due to the small volume of the first protection space, in the preparation of the pressure equalization between the interior of the electrode and the first protection space there is still a sufficiently large overpressure within the electrode to ensure the operative readiness of the electrode after storage, transport or retention.

The electrochemical electrode can for example, include a pressurized flowable electrolyte so that the electrolyte exits through the liquid junction into the first protection space. The liquid junction is the junction between the electrolyte within the electrode and the medium to be examined. The liquid junction may be small openings, ceramic diaphragms or ground-joint diaphragms. They enable, that the electrolyte can slowly flow out of the printed electrode. The electrolyte is at least flowable and for example, liquid.

The electrochemical electrode may be configured as an electrochemical reference electrode or as part of a combination electrode.

Figure 1:
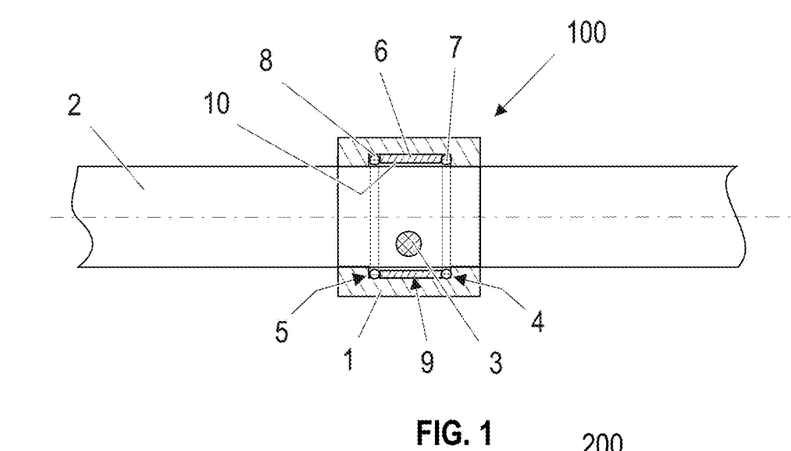
FIG. 1 shows an exemplary embodiment of a protective device for an electrode having a liquid junction in its use state, wherein the protective device is shown in section.

FIG. 1 shows an exemplary embodiment of a protective device 100 for an electrochemical electrode 2 having a liquid junction 3 in its use state, wherein protective device 100 is shown as sectional view. Electrode 2 is only indicated here and may represent any type of electrochemical electrode having a liquid junction 3; for example, an electrochemical reference electrode or a sensor with an electrochemical reference electrode having a liquid junction.

Protective device 100 can include a casing 1 configured as a hollow cylinder and which is open at both ends, and has, in this embodiment, a circumferential first protrusion 4 in the interior of casing 1, and a delimiting means 5, which here is configured as a circumferential second protrusion in the interior of casing 1. The two protrusions 4, 5 are configured so that a first casing segment 9 having an enlarged inner diameter d1 (see FIG. 2) extends between them. In the operative condition shown here, a spacer 6, and a first sealing ring 7 and a second sealing ring 8 are disposed in the casing segment 9. Spacer 6 is configured as a hollow cylinder and has an outer diameter which approximately corresponds to the inner diameter d1 of casing segment 9, so that spacer 6 is disposed with some tolerance in casing segment 9. The inner diameter d2 (see FIG. 2) of spacer 6 is dimensioned so that a first protection space 10 can form between spacer 6 and electrode 2. For this purpose, spacer 6 in casing 1 is supported with some tolerance and thus displaceable or movable. The two sealing rings 7, 8 are here elastically deformable polymeric sealing rings and seal, in its use state, first protection space 10 against electrode 2, so that liquid junction 3 is disposed in protection space 10, and an electrolyte contained in the electrode can only enter into protection space 1 through liquid junction 3.

Figure 2:
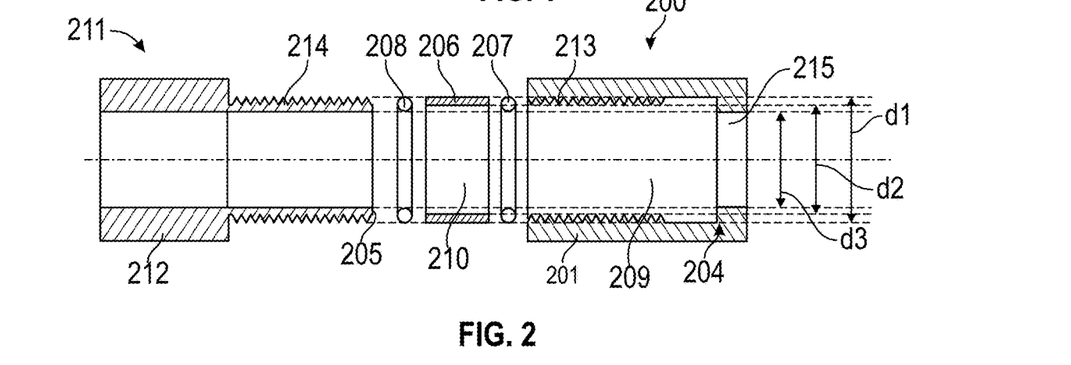
FIG. 2 shows an exploded view of another exemplary embodiment of a protective device with a casing and a fastening element in section.

FIG. 2 shows an exploded view of another exemplary embodiment of a protective device 200 having a casing 201, a fastening element 211 and a spacer 206 in section.

Casing 201 is configured as a hollow cylinder that is open on both sides, wherein casing 201 again has a first protrusion 204 delimiting a first casing segment 209 having a first inner diameter d1 from an opening 215 having a third inner diameter d3. The end of casing 201 opposite to opening 215 also has a first connecting means 213, which is configured here as a female thread.

Fastening element 211 is also configured as a hollow cylinder and has a substantially uniform inner diameter which approximately corresponds to diameter d3 of opening 215. In this way, it can be ensured that protective device 211, can be placed on an electrode in order to place its liquid junction in the first protection space, as shown, e. g., in FIG. 1. Fastening element 211 has a delimiting means 205 at its end facing casing 201 in the assembled state, which here is the closing edge of fastening element 211, and a second connecting means 214, which is configured as a male thread. In the assembled sate, second connecting means 214 engages with first connecting means 213.

Fastening element 211 has a grip segment 212 at one end, which may be ribbed, for example, on the outside in order to facilitate insertion into and screwing with casing 201, so that, in its use state, delimiting means 205 abuts second sealing ring 207, and in doing so exerts pressure on spacer 206 and the two sealing rings 207, 208 and thus seals the first protection space 210 against an electrode.

Protective device 200 is brought into operative readiness (see FIGS. 1, 4 and 5) by pushing fastening means 211 and casing 201, together or sequentially, onto an electrode to be protected. For this purpose, casing 201 is held firmly at the end near opening 215, while fastening element 211 is connected to casing 201 until protective device 200 is properly attached to the electrode, sealing the liquid junction as already described.

Figure 3:
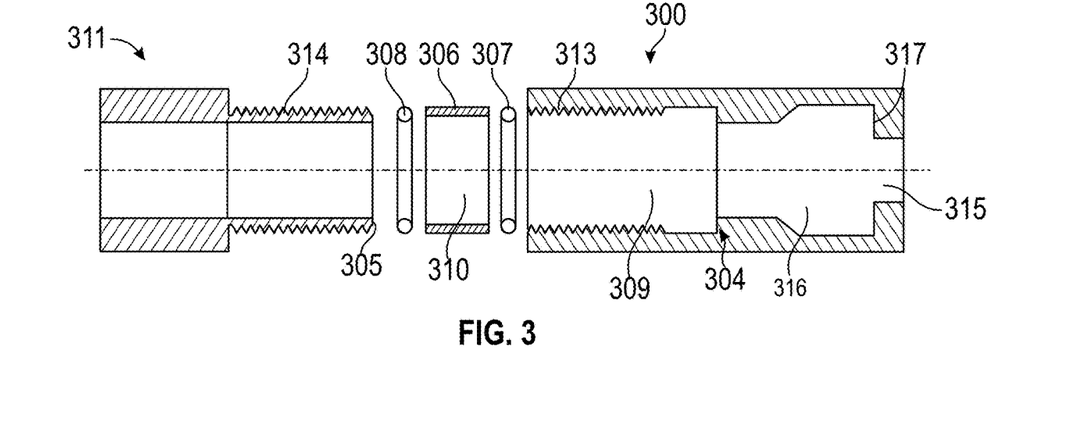
FIG. 3 shows an exploded view of another exemplary embodiment of a protective device with a casing, having a first and second casing segment, and a fastening element in section.

FIG. 3 shows an exploded view of another exemplary embodiment of a protective device 300 having a casing having a first casing segment 309 and a second casing segment 316, with a fastening element 311, a spacer 306 and a first sealing ring and a second sealing ring 307, 308 in section.

Fastening element 311, spacer 306, the two sealing rings 307, 308 and the first casing segment 309 essentially correspond to the elements already described in connection with FIG. 2.

Additionally, the casing can include a second casing segment 316 following first casing 309 and in which a stop 317 is provided for an end of the electrode. For example, first and second casing segments 309, 316 represent a single component or are configured integrally.

Figure 4:
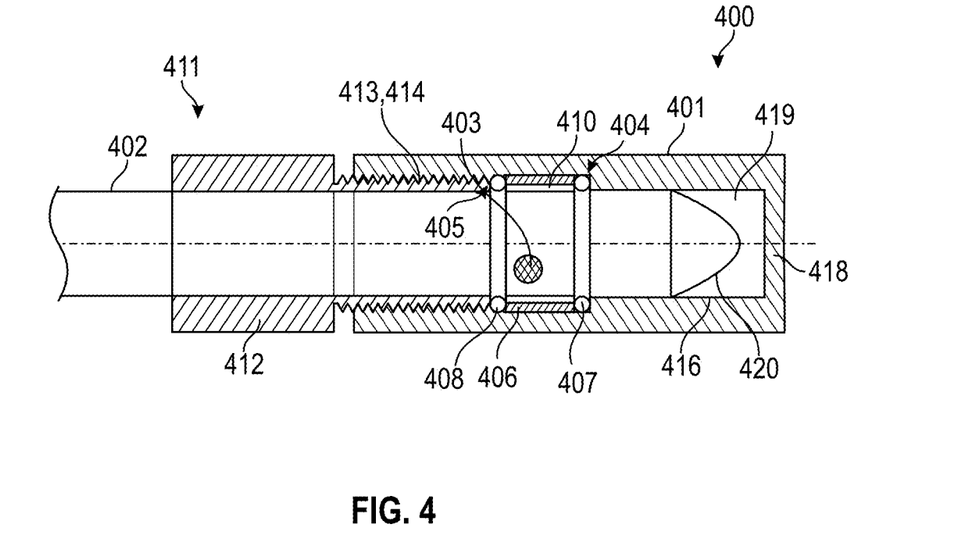
FIG. 4 shows another exemplary embodiment of a protective device with first and second protective spaces for an electrode with liquid junction in its use state, wherein the protective device is shown in section.

FIG. 4 shows a further exemplary embodiment of a protective device 400 in its use state with a casing 401, a fastening element 411, a spacer 406 and first and second sealing rings 407, 408.

Casing 401 can include a first casing segment 309 in which the two sealing rings 407, 408 and spacer 406 are disposed forming a first protection space 410 for a liquid junction 403 of an electrode 402. Fastening element 411 includes a delimiting means 405, which in this case exerts pressure on second sealing ring 408, spacer 406 and first sealing ring 407, so that the first protection space is sealed against electrode 402.

In addition, casing 401 can include a second protection space 419, which is formed by first protrusion 404 and a closed end 418 of casing 401. This protection space 419, in its use state, receives a sensitive end 420 of electrode 402, and may also contain a wetting liquid, which serves, for example, to wet sensitive end 420 during transportation, storage or retention.

Figure 5:
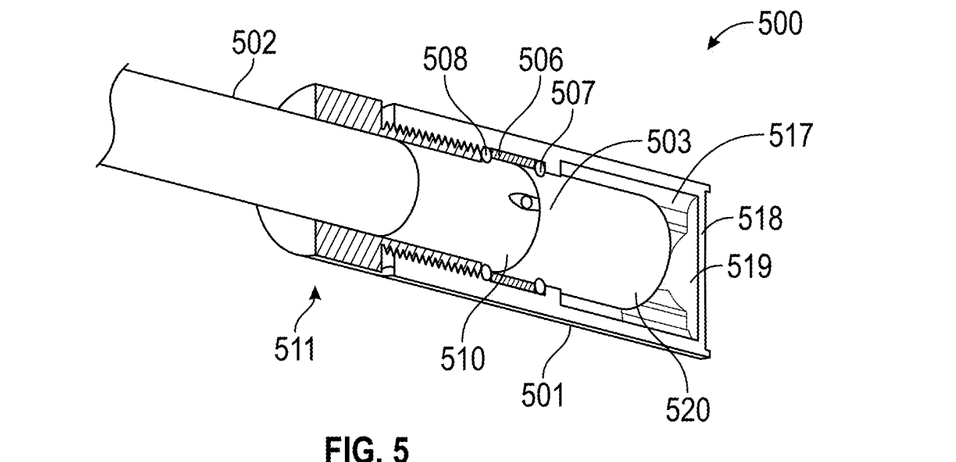
FIG. 5 shows another exemplary embodiment of a protective device for an electrode with liquid junction in its use state, wherein the protective device is shown in section.

FIG. 5 shows an exemplary embodiment of a protective device 500 for an electrode 502 having a liquid junction 503 in its use state, wherein protective device 500 is shown in section.

Liquid junction 503 is located in first protection space 510 and a sensitive end 520 of electrode 502 is located in second protection space 519, which is disposed in the second casing segment which is closed at one end, and includes a stop 517 for electrode 502. The stop 517 can be both fixedly connected to casing 501 and configured as a removable insert.

Figure 6:
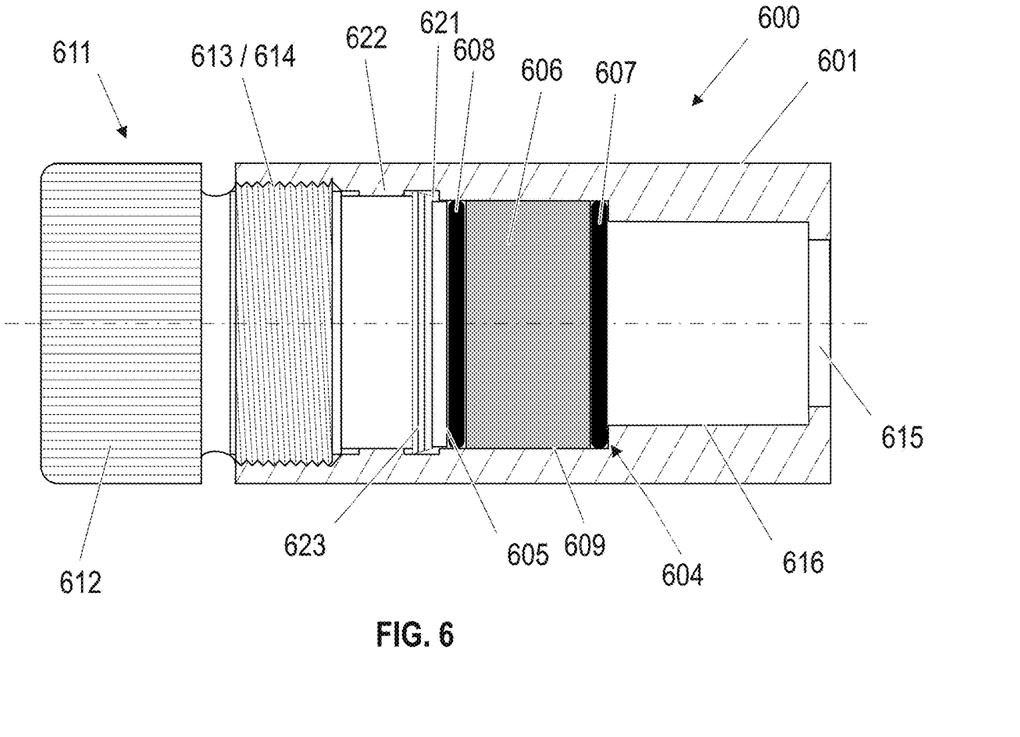
FIG. 6 shows another exemplary embodiment of a protective device with casing and fastening element for an electrode with liquid junction in the assembled state, wherein the casing is shown in section.

FIG. 6 shows an exemplary embodiment of a protective device 600 with casing 601 and fastening element 611 for an electrode with liquid junction in the assembled state, wherein only the casing is shown in section.

As already described in connection with FIGS. 1 to 5, the protective device 600 can include a spacer 606 and first and second sealing rings 607, 608 which, in the illustrated assembled state, are disposed in a first casing segment 609, which is formed on one side by a first protrusion 604 circumferentially formed in casing 601, and a delimiting means 605 which is formed on fastening element 611. Furthermore, protective device 600 may include a second casing segment 616 which follows first casing segment 609 and which is represented here with outwardly open end 615. The inner diameters of the various elements substantially correspond to those in the preceding figures.

Additionally, casing 601 has a third casing segment 621 which is formed as a circumferential groove and is delimited by a third protrusion 622. Third casing 621 follows first casing segment 609 on the side facing fastening element 611.

Fastening element 611 again has a grip segment 612 and delimiting means 605. It also has a bead 623, which is located near delimiting means 605. In the assembled state, bead 623 engages with tolerance groove 621 and holding together fastening element 611 and casing 601, and also protects two sealing rings 607, 608 and spacer 606 against loss or falling out. Once an electrode is inserted into protective device 600, fastening element 611 can be screwed deeper into the casing, so that the two sealing rings 607, 608 seal a first protection space against the electrode, groove 621 delimiting the penetration of fastening element 611 and thus also limiting the pressure acting on the two sealing rings 607, 608. For this purpose, fastening element 611 and casing 601 each have a connecting means 613, 614 which engage in the assembled state, and for example are configured as male or female threads.

Figure 7:
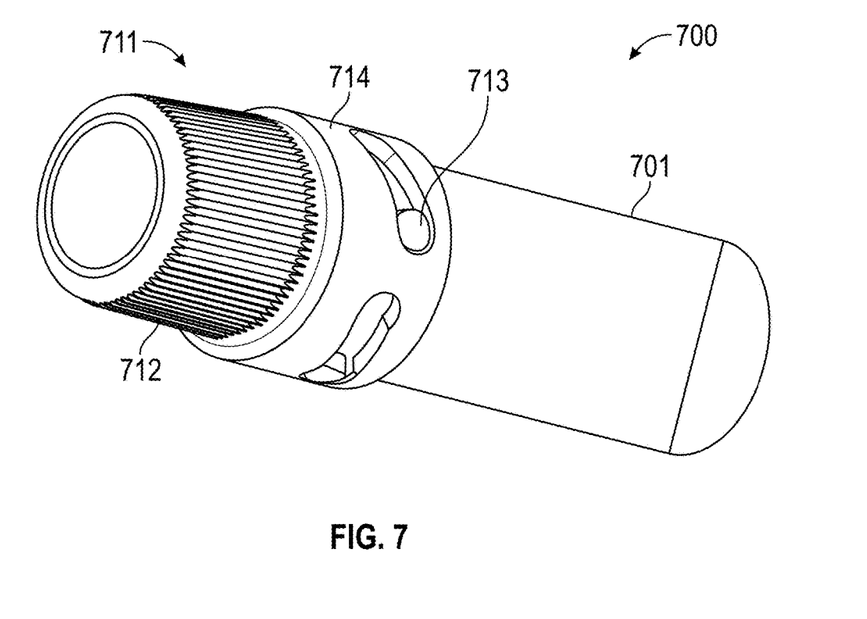
FIG. 7 shows a perspective view of another exemplary embodiment of a protective device with bayonet in the assembled state.

FIG. 7 shows a perspective view of exemplary embodiment of a protective device 700 with bayonet mount in the assembled state and therefore without electrode.

Protective device 700 can include a casing 700 and a fastening element 711, which differ from the embodiments shown in FIGS. 2 to 6 in that there is a bayonet mount for connecting and detaching casing 700 and fastening element 711 instead of a threaded connection. In this case, casing 701 has a first connecting element 713 with a plurality of circumferentially disposed projections near the end facing fastening element 711, and fastening element 711 has a corresponding second connecting element 714 with elongated locking openings disposed obliquely to the circumference. These locking openings are connected with insertion grooves extending on the inner side of fastening element 711 in the longitudinal direction of protective device 700, which insertion grooves extend up to the end of fastening element 711 facing casing 701. At the end of fastening element 711 facing away from casing 701 a grip segment 712 with knurling for better handling.

When placing fastening element 711 on casing 701 the projections are guided in the locking openings through the insertion grooves. In this case, protective device 700 is in its assembled state.

After insertion of an electrode in protective device 700, the projections are guided in the locking openings by rotating fastening element 711 with respect to casing 701 in such a way that they reach the locking positions incorporated in the locking openings and establish there a form-fitting and force-fitting connection.

In this case, a force is also exerted on the two sealing rings (see FIGS. 1 to 6) in the case of projections locked in the locking positions of the locking openings due to the oblique arrangement of the locking openings and the associated displacement of the fastening element 711 with respect to casing 701 in the longitudinal direction of protective attachment 700. These sealing rings deform correspondingly, as already stated, and thus seal the area around the liquid junction between the electrode, more specifically the shaft of the electrochemical electrode and the inner wall of casing 701 while forming a first protective chamber with the spacer. Locking recesses can be incorporated in fastening element 711 instead of locking openings.

The material to be considered for the casing and the spacer may be, for example, solid polymers such as polycarbonate, acrylic glass or polyethylene terephthalate (PET), especially PET-G, etc. or other suitable materials. Metals or glass may be used under certain conditions, for example, for particularly hygienic or very harsh conditions. For the fastening element either flexible polymers such as polyethylene (PE) or polyoxymethylene (POM) may be chosen, but also here solid polymers such as polycarbonate may be used advantageously as may other suitable materials. Reasonably, these materials, as well as the material(s) of the two sealing rings should be resistant to liquids with whom they come in contact in its use state; for example, they should be resistant to the electrolyte of the electrode and/or the wetting liquid.

The protective device, in its use state, performs the functions of sealing the liquid junction, and also depending on the embodiment, of mechanical protection of an electrochemical electrode. For this purpose, the protective device can, for example, protect the liquid junction and one end of the electrode, or additionally can include a reservoir for the wetting liquid in the form of the second protection space and thus keep a sensitive end or a sensitive region of the electrode moist. Herein, a sensitive region is understood to mean the region of the electrode where a measuring element is arranged.

The invention has been shown and described based on preferred embodiments. However, embodiments and developments of the invention not expressly mentioned here shall be included within the scope of the disclosure. For example, instead of an electrochemical electrode formed as a combination electrode, even a simple reference electrode under overpressure with a reference liquid in conjunction with a protective attachment can form a system for retaining and transporting an electrochemical electrode. It is also possible to combine the shown fastening elements and casing variations in any way.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE SIGNS LIST 100, 200, 300, 400, 500, 600, 700 protective device
1, 201, 301, 401, 501, 601, 701 casing
2, 402, 502 electrode
3, 403, 503 liquid junction
4, 204, 304, 404 first protrusion
5, 205, 305, 405, 605 delimiting means
6, 206, 306, 406, 506, 606 spacer
7, 207, 207, 307, 407, 507, 607 first sealing ring
8, 208, 308, 408, 508, 608 second sealing ring
9, 209, 309, 609 first casing segment
10, 210, 310, 410 first protection space
211, 311, 411, 511, 611, 711 fastening element
212, 412, 612, 712 grip segment
213, 313, 413, 613, 713 first connecting means
214, 314, 414, 614, 714 second connecting means
215, 315, 615 opening
316, 416, 616 second casing segment
317, 517 stop
418, 518 closed end
419, 519 second protection space
420, 520 sensitive region
621 third casing segment/groove
622 third protrusion
623 bead

The invention claimed is:

1. A protective device for electrochemical electrodes having a liquid junction, the protective device comprising:
 a casing which is configured as a hollow cylinder and which has an inner circumferential first inwardly extending protrusion;
 a delimiting means which together with the first protrusion delimits a first casing segment having a first inner diameter;
 a spacer, which is configured as a hollow cylinder having an outer diameter corresponding to the first inner diameter; and
 a first sealing ring and a second sealing ring between which the spacer is disposed;
 wherein the first sealing ring, the second sealing ring and the spacer are disposed in an interior of the first casing segment, so that the first sealing ring and the second seal ring delimit a first protection space for a liquid junction whose inner diameter corresponds to an inner diameter of the spacer.

2. The protective device according to claim 1, wherein the delimiting means is configured as a flat surface in an interior of the casing.

3. The protective device according to claim 2, wherein the casing comprises:
 a first connecting means; and
 wherein the protective device comprises:
 a fastening element, which is configured as a hollow cylinder and includes the delimiting means and a second connecting means for connecting the fastening element with the casing;
 wherein the flat surface of the delimiting means is disposed at a first end of the fastening element, so that in an assembled state, the delimiting means will press pressed against the second sealing ring and thus exert pressure on the first and second sealing rings.

4. The protective device according to claim 3, wherein the fastening element comprises:
 a structured grip segment at a second end.

5. The protective device according to claim 4, wherein the casing comprises:
 a second casing segment which is configured as a hollow cylinder and is connected terminally with the first casing segment.

6. The protective device according to claim 1, wherein the casing comprises:
 a first connecting means; and
 wherein the protective device comprises:
 a fastening element, which is configured as a hollow cylinder and includes the delimiting means and a second connecting means for connecting the fastening element with the casing;
 wherein the delimiting means is a first end of the fastening element, so that in an assembled state, the delimiting means will press pressed against the second sealing ring and thus exert pressure on the first and second sealing rings.

7. The protective device according to claim 6, wherein the first connecting means is configured as a female thread and the second connecting means is configured as a male thread.

8. The protective device according to claim 6, wherein the first connecting means and the second connecting means are configured as parts of a bayonet connection.

9. The protective device according to claim 6, wherein the fastening element comprises:
a structured grip segment at a second end.

10. The protective device according to claim 9, wherein the fastening element comprises:
a bead which is disposed between the grip segment and the first end of the fastening element, wherein, in the assembled state, the bead engages a groove on the casing with clearance and thus forms a stop for the fastening element.

11. The protective device according to claim 6, wherein the fastening element is made of polycarbonate or polyoxymethylene (POM).

12. The protective device according to claim 1, wherein the casing comprises:
a second casing segment which is configured as a hollow cylinder and is connected terminally with the first casing segment.

13. The protective device according to claim 12, wherein the second casing segment is closed on one side so that in an interior of the second casing segment a second protection space for receiving a wetting liquid is formed.

14. The protective device according claim 13, wherein the second casing segment comprises:
a stop for one end of the electrode.

15. The protective device according to claim 14, wherein the casing is made of polycarbonate, polymethyl methacrylate (PMMA) or polyethylene terephthalate (PET-G).

16. The protective device according claim 12, wherein the second casing segment comprises:
a stop for one end of the electrode.

17. The protective device according to claim 1, wherein the casing is made of polycarbonate, polymethyl methacrylate (PMMA) or polyethylene terephthalate (PET-G).

18. A transport and retention configuration comprising the protective device according to claim 1, in combination with:
an electrochemical electrode having a liquid junction, wherein the liquid junction of the electrochemical electrode is disposed in the first protection space of the protective device during transport, storage and/or retention.

19. The transport and retention configuration according to claim 18, wherein the electrochemical electrode comprises:
a pressurized flowable electrolyte so that the electrolyte exits through the liquid junction in the first protection space.

20. The transport and retention configuration according to claim 18, wherein the electrochemical electrode is an electrochemical reference electrode, or part of a combination electrode.

* * * * *